(12) United States Patent
Hsu et al.

(10) Patent No.: US 9,923,028 B1
(45) Date of Patent: Mar. 20, 2018

(54) RESISTIVE MEMORY AND METHOD FOR MANUFACTURING THE SAME

(71) Applicant: UNITED MICROELECTRONICS CORP., Hsinchu (TW)

(72) Inventors: Wen-Hsin Hsu, Chiayi (TW); Ko-Chi Chen, Taoyuan (TW); Tzu-Yun Chang, Hsinchu County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/402,630

(22) Filed: Jan. 10, 2017

(30) Foreign Application Priority Data

Dec. 2, 2016 (CN) .......................... 2016 1 1099421

(51) Int. Cl.
*H01L 45/00* (2006.01)
*H01L 27/24* (2006.01)
*H01L 23/528* (2006.01)

(52) U.S. Cl.
CPC ........ *H01L 27/2463* (2013.01); *H01L 23/528* (2013.01); *H01L 27/2436* (2013.01); *H01L 45/08* (2013.01); *H01L 45/1226* (2013.01); *H01L 45/1246* (2013.01); *H01L 45/1253* (2013.01); *H01L 45/146* (2013.01); *H01L 45/147* (2013.01); *H01L 45/1608* (2013.01)

(58) Field of Classification Search
CPC ............. H01L 27/2436; H01L 27/2463; H01L 45/1226; H01L 45/146; H01L 45/147; H01L 45/1253; H01L 45/08; H01L 45/085; H01L 45/145
See application file for complete search history.

(56) References Cited

U.S. PATENT DOCUMENTS

| 2008/0232154 | A1* | 9/2008 | Kinoshita | G11C 13/0007 365/148 |
| 2009/0272962 | A1* | 11/2009 | Kumar | H01L 45/08 257/4 |
| 2013/0240821 | A1* | 9/2013 | Toh | H01L 27/2409 257/4 |
| 2014/0175371 | A1 | 6/2014 | Karpov et al. | |
| 2016/0359108 | A1* | 12/2016 | Majhi | H01L 45/1226 |

FOREIGN PATENT DOCUMENTS

WO    WO 2015147801 A1 * 10/2015 ......... H01L 45/1226

* cited by examiner

*Primary Examiner* — Robert Bachner
*Assistant Examiner* — Molly Reida
(74) *Attorney, Agent, or Firm* — WPAT, PC

(57) ABSTRACT

A semiconductor structure includes a memory unit structure. The memory unit structure includes a transistor, a first electrode, two second electrode, and two resistive random access memory (RRAM) elements. The first electrode and the two second electrodes are disposed in a horizontal plane. The first electrode is disposed between the two second electrodes. The first electrode and the two second electrodes are disposed in parallel. The first electrode is coupled to a source region of the transistor. One of the two RRAM elements is disposed between the first electrode and one of the two second electrodes. The other one of the two RRAM elements is disposed between the first electrode and the other one of the two second electrodes.

10 Claims, 5 Drawing Sheets

RESISTIVE MEMORY AND METHOD FOR MANUFACTURING THE SAME

This application claims the benefit of People's Republic of China application Serial No. 201611099421.X, filed Dec. 2, 2016, the subject matter of which is incorporated herein by reference.

TECHNICAL FIELD

This disclosure relates to a semiconductor structure and a method for manufacturing the same. More particularly, this disclosure relates to a semiconductor structure comprising resistive random access memory (RRAM) elements and a method for manufacturing the same.

BACKGROUND

Memories have been widely used in electronic systems for data storage. They can be divided into two categories: volatile memory and non-volatile memory. A volatile memory requires power to maintain the stored information. In contrast, a non-volatile memory retains its information even when power is turned off. The most widely used type of non-volatile memory today is flash memory. However, as the shrinkage of memory sizes, the development of flash memories is blocked due to their physical limit. Therefore, other types of non-volatile memory, such as resistive random access memory (RRAM), phase change random access memory (PCRAM), magnetoresistive random access memory (MRAM), and the like, have been proposed.

SUMMARY

This disclosure is directed to a semiconductor structure comprising memory elements and a method for manufacturing the same, more particularly to a semiconductor structure comprising RRAM elements and a method for manufacturing the same.

According to some embodiments, a semiconductor structure comprises a substrate, a plurality of first metal lines, a plurality of second metal lines, an array of RRAM elements, a plurality of transistors, and a plurality of bit lines. The first metal lines and the second metal lines are disposed alternately in a plane that is horizontally positioned on the substrate. The array of RRAM elements is disposed in the plane. Each of the RRAM elements is positioned between one of the first metal lines and one of the second metal lines that is adjacent to the one of the first metal lines. Source regions of the transistors are coupled to the first metal lines, respectively. The bit lines are coupled to the second metal lines, respectively.

According to some embodiments, a semiconductor structure comprises a memory unit structure. The memory unit structure comprises a transistor, a first electrode, two second electrodes, and two RRAM elements. The first electrode and the two second electrodes are disposed in a horizontal plane. The first electrode is disposed between the two second electrodes. The first electrode and the two second electrodes are disposed in parallel. The first electrode is coupled to a source region of the transistor. One of the two RRAM elements is disposed between the first electrode and one of the two second electrodes. The other one of the two RRAM elements is disposed between the first electrode and the other one of the two second electrodes.

According to some embodiments, a method for manufacturing a semiconductor structure comprises the following steps. At first, a preliminary structure is provided. The preliminary structure comprises a substrate, a plurality of transistors, and a dielectric layer. The transistors are formed on the substrate. The dielectric layer is formed on the substrate and the transistors. Then, a plurality of metal lines are formed on the dielectric layer of the preliminary structure. The metal lines comprise a plurality of first metal lines and a plurality of second metal lines disposed alternately. The first metal lines are coupled to the transistors, respectively. A plurality of barrier layers are formed on sidewalls of the first and second metal lines, respectively. Thereafter, a plurality of resistance-variable layers are formed. Each of the resistance-variable layers is between one of the barrier layers that is formed on one of the first metal lines and one of the barrier layers that is formed on one of the second metal lines and adjacent to the one of the barrier layers that is formed on the one of the first metal lines.

Figure 1:
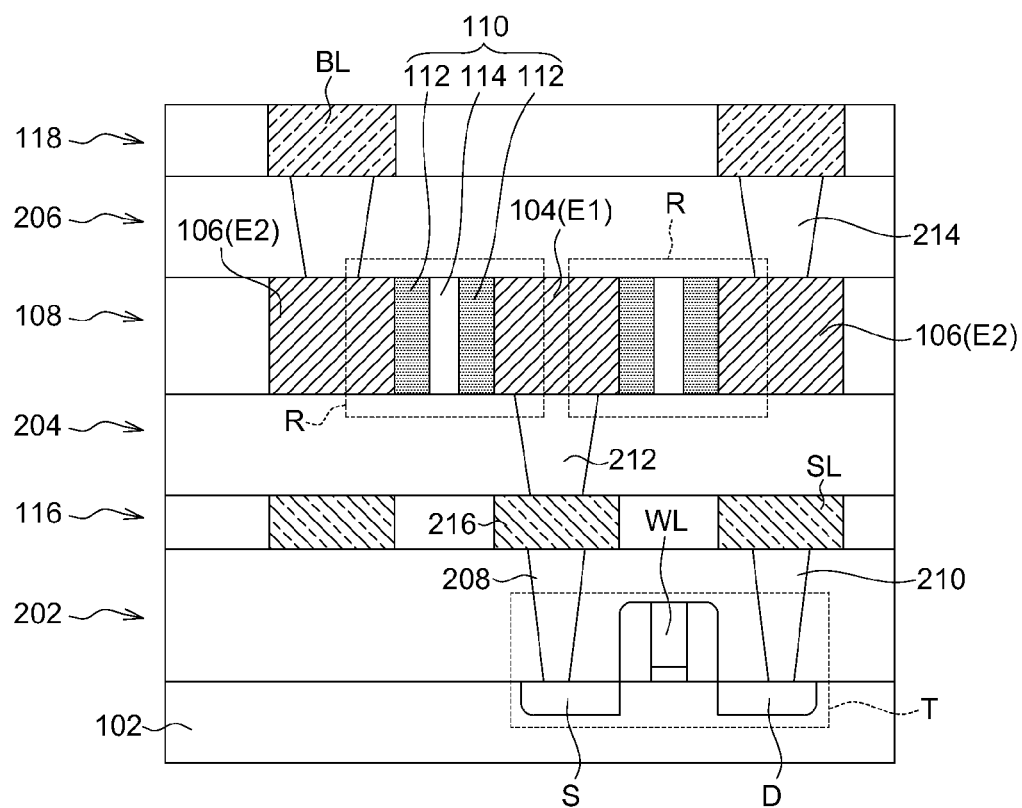
FIG. 1 illustrates a semiconductor structure according to embodiments.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. For clarity, some elements may be omitted from the figures. For example, the semiconductor structure may comprise a plurality of the same elements, but only one or some of them are illustrated in the figures. In addition, the elements in the figures may not reflect their real sizes. The terms used to illustrate spatial relationships, such as "on", "under", "adjacent to", or the like, may encompass both the conditions of directly contact and indirectly contact. It is contemplated that elements and features of one embodiment may be beneficially incorporated in another embodiment without further recitation.

Referring to FIG. 1, a semiconductor structure according to embodiments is shown. The semiconductor structure comprises a substrate 102, a plurality of first metal lines 104, a plurality of second metal lines 106, an array of RRAM elements 110, a plurality of transistors T, and a plurality of bit lines BL. The first metal lines 104 and the second metal lines 106 are disposed alternately in a plane 108 that is horizontally positioned on the substrate 102. According to some embodiments, the first metal lines 104 and the second metal lines 106 are disposed in parallel. The array of RRAM elements 110 is also disposed in the plane 108. Each of the RRAM elements 110 is positioned between one of the first metal lines 104 and one of the second metal lines 106 that is adjacent to the one of the first metal lines 104. Each of the transistors T may comprise a source region S and a drain region D. The source regions S of the transistors T are coupled to the first metal lines 104, respectively. The bit lines BL are coupled to the second metal lines 106, respectively.

According to some embodiments, each of the RRAM elements 110 comprises two barrier layers 112 and a resistance-variable layer 114. The two barrier layers 112 are disposed on a sidewall of the corresponding first metal line 104 and a sidewall of the corresponding second metal line 106, respectively. The resistance-variable layer 114 is disposed between the two barrier layers 112. According to some embodiments, the barrier layers 112 may be formed of a metal or a transition metal oxide. For example, the barrier layers 112 may comprise at least a material selected from the group consisting of: Al, Ti, Ta, Au, Ag, Pt, W, Ni, Ir, Cu, $NiO_x$, $Ta_yO_x$, $TiO_x$, $HfO_x$, $WO_x$, $ZrO_x$, $Al_yO_x$, $SrTiO_x$, $Nb_yO_x$ and $Y_yO_x$. According to some embodiments, the resistance-variable layers 114 may be formed of a transition metal oxide. For example, the resistance-variable layers 114 may comprise at least a material selected from the group consisting of: $NiO_x$, $Ta_yO_x$, $TiO_x$, $HfO_x$, $WO_x$, $ZrO_x$, $Al_yO_x$, $SrTiO_x$, $Nb_yO_x$ and $Y_yO_x$. According to some embodiments, the barrier layers 112 are more metal-rich than the resistance-variable layers 114.

The portions of the first metal lines 104 that are adjacent to the RRAM elements 110 may be referred to as first electrodes E1 of memory unit structures. The portions of the second metal lines 106 that are adjacent to the RRAM elements 110 may be referred to as second electrodes E2 of memory unit structures. In the embodiments described herein, a memory unit structure of the semiconductor structure comprises a transistor T, a first electrode E1, two second electrodes E2, and two RRAM elements 110. The first electrode E1 and the two second electrodes E2 are disposed in the horizontal plane 108, wherein the first electrode E1 is disposed between the two second electrodes E2, and the first electrode E1 and the two second electrodes E2 are disposed in parallel. The first electrode E1 is coupled to the source region S of the transistor T. One of the two RRAM elements 110 is disposed between the first electrode E1 and one of the two second electrodes E2, and the other one of the two RRAM elements 110 is disposed between the first electrode E1 and the other one of the two second electrodes E2.

More specifically, the memory unit structure is a combination of one transistor T and two RRAM cells R coupled to the transistor T. One of the two RRAM cells R comprises the first electrode E1, one of the two second electrodes E2 and one of the two RRAM elements 110, and the other one of the two RRAM cells R comprises the first electrode E1, the other one of the two second electrodes E2 and the other one of the two RRAM elements 110. Since, according to the embodiments, a transistor T can be used to control two RRAM cells R, the number of the transistors T can be decreased. Thereby, a higher cell density can be reached.

The second metal lines 106 and thereby the second electrodes E2 of the RRAM cells R are coupled to the bit lines BL. The first metal lines 104 and thereby the first electrodes E1 of the RRAM cells R are coupled to the transistors T. Further, in some embodiments, the transistors T are coupled to a plurality of word lines WL, respectively. For example, the gate electrode of the transistors T extend and be used as the word lines WL. As such, a memory unit structure can be controlled by two bit lines BL and a word line WL. In some embodiments, the transistors T are further coupled to a plurality of source lines SL, respectively, such as through their drain regions D.

In some embodiments, as shown in FIG. 1, the transistors T are disposed on the substrate 102 and at a level lower than the plane 108. In some embodiments, as shown in FIG. 1, the bit lines BL are disposed at a level higher than the plane 108. According to some embodiments, the semiconductor structure may comprise one or more metal levels under and/or above the plane 108. For example, as shown in FIG. 1, a first dielectric layer 202 may be disposed on the substrate 102 and cover the transistors T. A first metal level 116 may be disposed on the first dielectric layer 202, wherein the source lines SL may be formed in the metal level 116. A second dielectric layer 204 may be disposed on the metal level 116. The plane 108, being the second metal level, is disposed on the dielectric layer 204. A third dielectric layer 206 may be disposed on the plane 108. A third metal level 118 may be disposed on the dielectric layer 206, wherein the bit lines BL may be formed in the metal level 118. Vias may be formed in the dielectric layers for providing electrical connections. For example, in FIG. 1, vias 208 are formed in the dielectric layer 202 and connect the source regions S of the transistors T to a connecting portion 216 formed in the metal level 116. Vias 210 are formed in the dielectric layer 202 and connect the drain regions D of the transistors T to the source lines SL. Vias 212 are formed in the dielectric layer 204 and connect the connecting portion 216 to the first metal lines 104. Vias 214 are formed in the dielectric layer 206 and connect the second metal lines 106 to the bit lines BL. However, the semiconductor structure according to embodiments is not limited by the configuration as described above.

Now the description is directed to a method for manufacturing a semiconductor structure according to embodiments. The method comprises the following steps. At first, a preliminary structure is provided. The preliminary structure comprises a substrate, a plurality of transistors, and a dielectric layer. The transistors are formed on the substrate. The dielectric layer is formed on the substrate and the transistors. Then, a plurality of metal lines are formed on the dielectric layer of the preliminary structure. The metal lines comprise a plurality of first metal lines and a plurality of second metal lines disposed alternately. The first metal lines are coupled to the transistors, respectively. A plurality of barrier layers are formed on sidewalls of the first and second metal lines, respectively. Thereafter, a plurality of resistance-variable layers are formed. Each of the resistance-variable layers is between one of the barrier layers that is formed on one of the first metal lines and one of the barrier layers that is formed on one of the second metal lines and adjacent to the one of the barrier layers that is formed on the one of the first metal lines. The details of the method will be illustrated with reference to FIGS. 2A-2J.

Figure 2A:
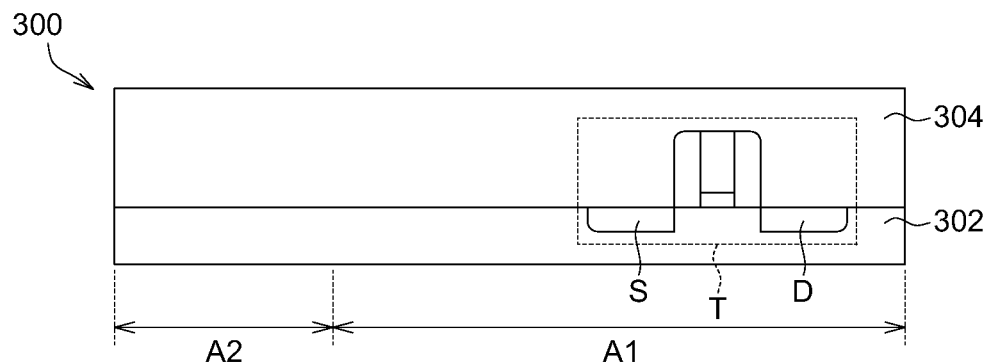
FIGS. 2A-2J illustrate a semiconductor structure at various stages of manufacturing process according to embodiments.

Referring to FIG. 2A, a preliminary structure 300 is provided. The preliminary structure 300 comprises a substrate 302, a plurality of transistors T, and a dielectric layer 304. The transistors T are formed on the substrate 302. According to some embodiments, the preliminary structure 300 has a cell region A1 and a logic region A2, and the transistors T are positioned in the cell region A1. The dielectric layer 304 is formed on the substrate 302 and the transistors T. For example, as shown in FIG. 2A, the dielectric layer 304 covers the transistors T.

Figure 2B:
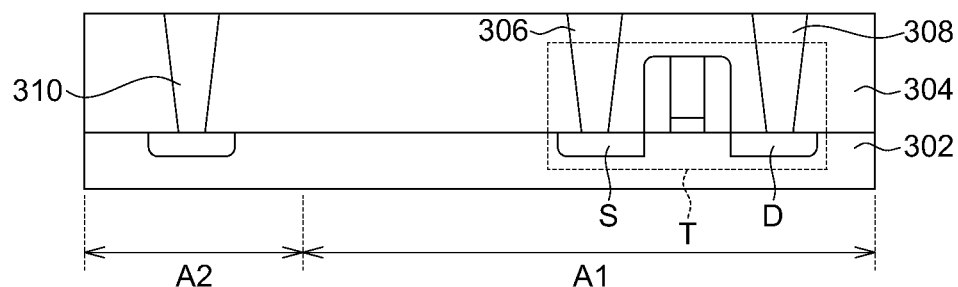

Referring to FIG. 2B, a plurality of vias 306, which are provided for connecting the transistors T to first metal lines formed in the following stage, may be formed through the dielectric layer 304 of the preliminary structure 300. In this step, other vias, such as vias 308 and 310, may also be formed.

Figure 2C:
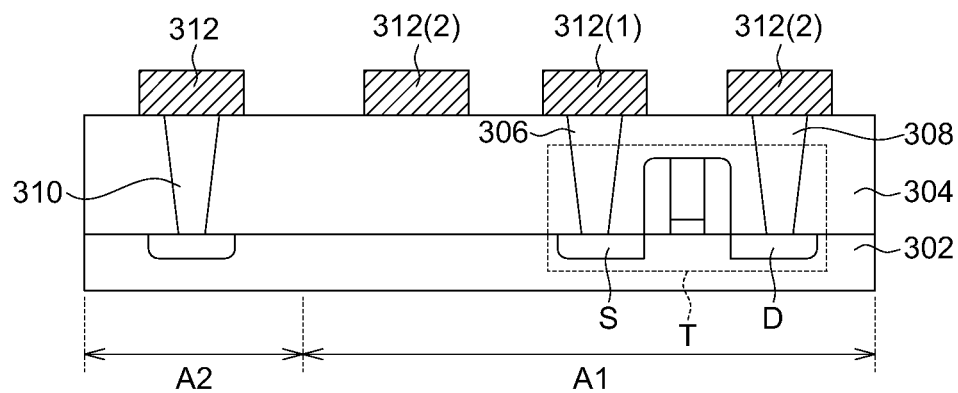

Referring to FIG. 2C, a plurality of metal lines 312 are formed on the dielectric layer 304 of the preliminary structure 300. The metal lines 312 comprise a plurality of first metal lines 312(1) and a plurality of second metal lines 312(2) disposed alternately. According to some embodiments, the first metal lines 312(1) and the second metal lines 312(2) are positioned in the cell region A1. The first metal lines 312(1) are coupled to the transistors T, respectively, such as through the vias 306. Here, the metal lines 312 are formed in a first metal level. However, they may be formed in a second metal level as in FIG. 1, or in still another metal level.

Figure 2D:
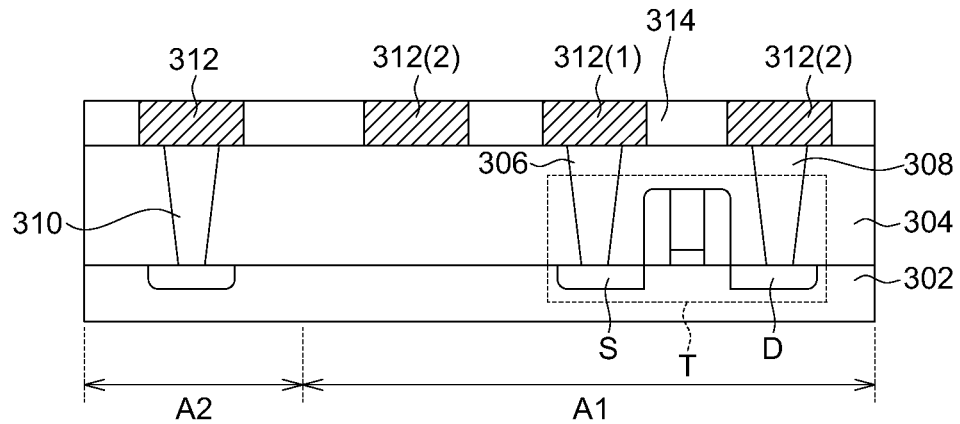
Figure 2E:
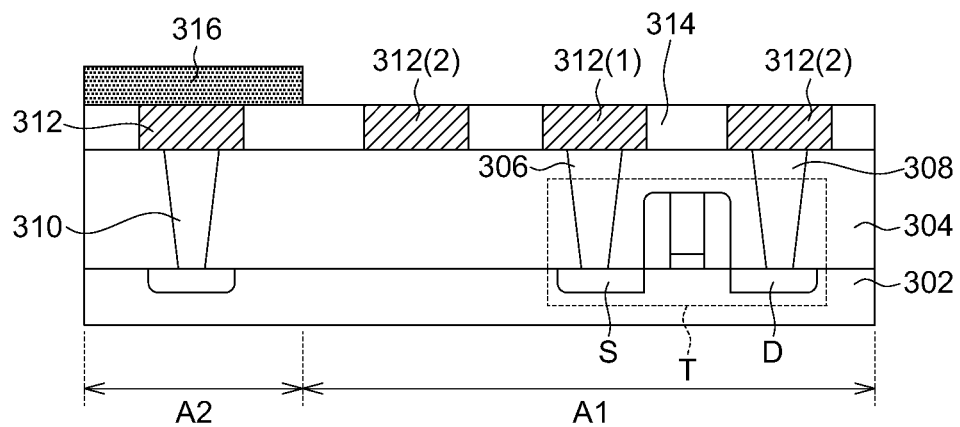
Figure 2F:
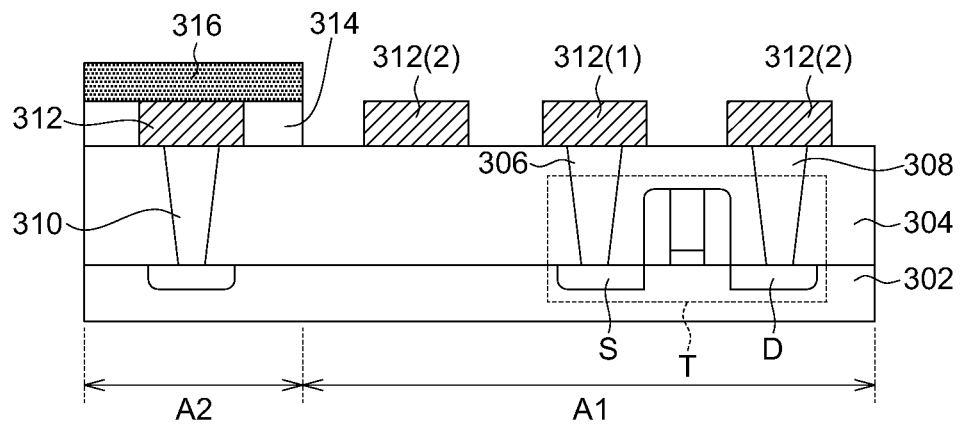

Referring to FIG. 2D, a dielectric material 314 may be formed on the preliminary structure 300 and fill trenches between the metal lines 312. Referring to FIG. 2E, a hard mask 316 may be formed on the portions of the dielectric material 314 and the metal lines 312 that are in the logic region A2. As such, the cell region A1 can be defined over the logic region A2. Then, as shown in FIG. 2F, the portions of the dielectric material 314 in the cell region A1 are removed. For example, the removing step can be conducted by an etching process, such as a dry etching process by reactive ion etch (RIE), ion milling, or the like.

Figure 2G:
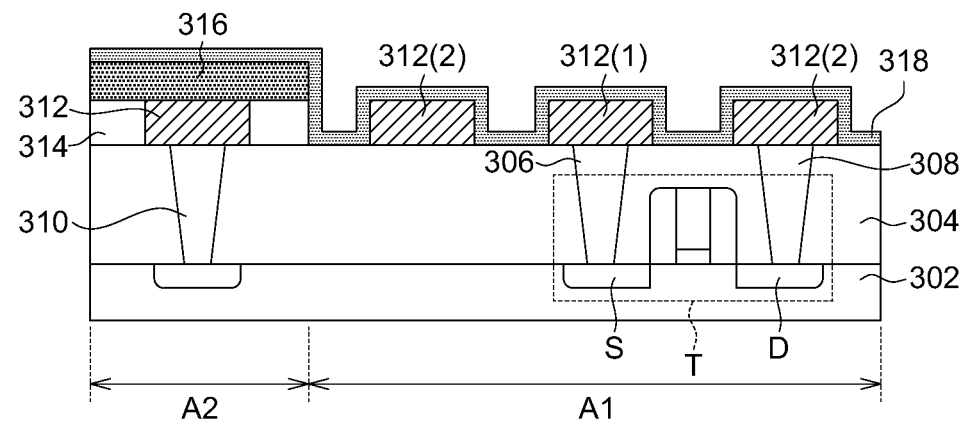

Referring to FIG. 2G, a barrier material 318 is formed. The barrier material 318 conformally covers the first metal lines 312(1), the second metal lines 312(2), and the dielectric layer 304. According to some embodiments, the barrier material 318 may comprise at least one selected from the group consisting of: Al, Ti, Ta, Au, Ag, Pt, W, Ni, Ir, Cu, $NiO_x$, $Ta_yO_x$, $TiO_x$, $HfO_x$, $WO_x$, $ZrO_x$, $Al_yO_x$, $SrTiO_x$, $Nb_yO_x$ and $Y_yO_x$. The forming step can be conducted by a deposition process, such as atomic layer deposition (ALD), chemical vapor deposition (CVD), physical vapor deposition (PVD), or the like.

Figure 2H:
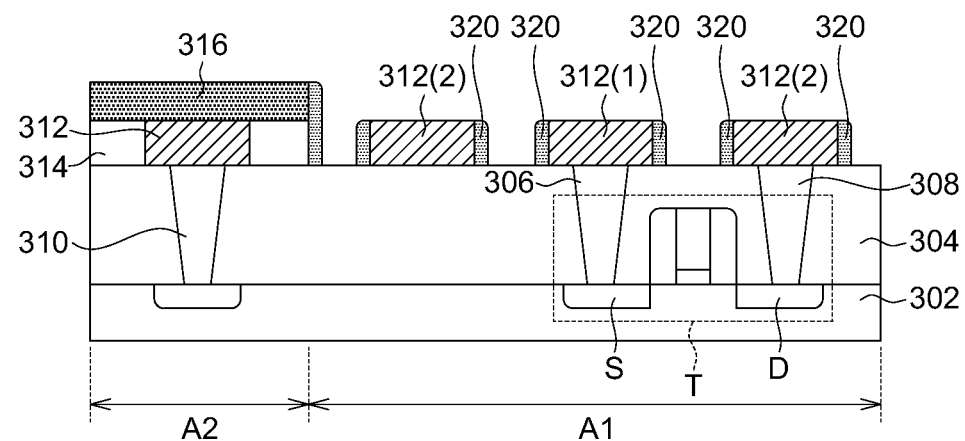

Referring to FIG. 2H, undesired portions of the barrier material 318 are removed such that the first metal lines 312(1), the second metal lines 312(2), and the portions of the dielectric layer 304 between the first metal lines 312(1) and the second metal lines 312(2) are exposed. As such, a plurality of barrier layers 320 are formed on sidewalls of the first metal lines 312(1) and the second metal lines 312(2), respectively. The removing step can be conducted by an etching process, such as a dry etching process by RIE, ion milling, or the like. The remaining portions of the barrier material 318 and thereby the barrier layers 320 may have a thickness between 10 Å and 200 Å.

Figure 2I:
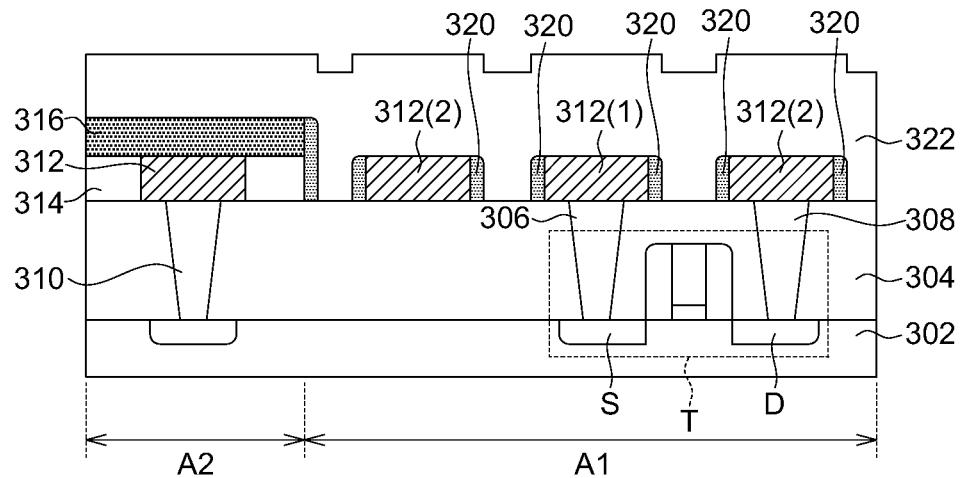

Referring to FIG. 2I, a resistance-variable material 322 is formed. The resistance-variable material 322 covers the first metal lines 312(1), the second metal lines 312(2), and the dielectric layer 304. According to some embodiments, the resistance-variable material 322 may comprise at least one selected from the group consisting of: $NiO_x$, $Ta_yO_x$, $TiO_x$, $HfO_x$, $WO_x$, $ZrO_x$, $Al_yO_x$, $SrTiO_x$, $Nb_yO_x$ and $Y_yO_x$. The forming step can be conducted by a deposition process, such as ALD, CVD, PVD, or the like.

Figure 2J:
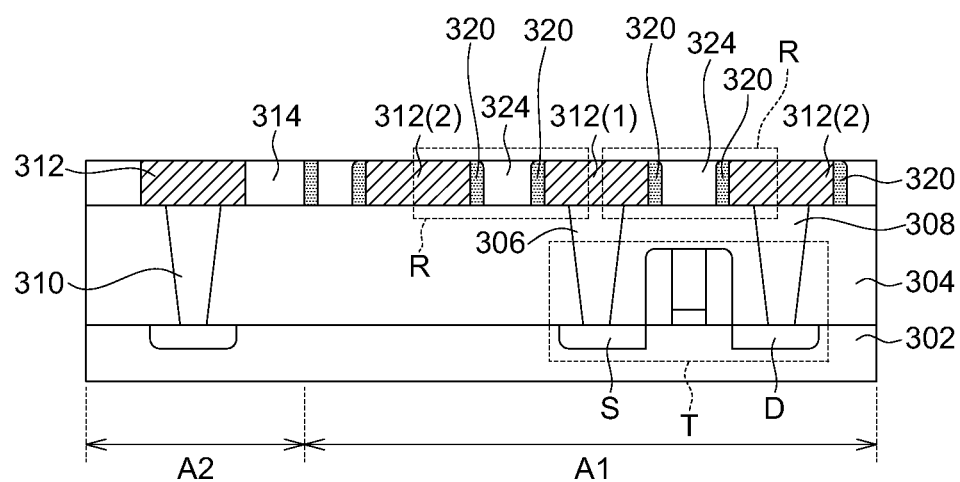

Referring to FIG. 2J, undesired portions of the resistance-variable material 322 are removed by a planarization process such that the first metal lines 312(1) and the second metal lines 312(2) are exposed. As such, a plurality of resistance-variable layers 324 are formed, wherein each of the resistance-variable layers 324 is between one of the barrier layers 320 that is formed on one of the first metal lines 312(1) and one of the barrier layers 320 that is formed on one of the second metal lines 312(2) and adjacent to the one of the barrier layers 320 that is formed on the one of the first metal lines 312(1). The planarization process can be a chemical mechanical planarization (CMP) process. Further, the hard mask 316 in the logic region A2 may also be removed by the planarization process.

The self-aligned processes as described above are compatible with the general method for manufacturing a semiconductor structure. Thereby, the method according to the embodiments is cost-saving. In addition, since the RRAM elements and the electrodes are formed in the same horizontal plane, which may be one of the metal levels that are typically disposed in the semiconductor structures, an additional level for the RRAM cells is not needed. As such, the structures in the cell region and the structures in the logic region can be formed in a more harmonious manner. Further, it is not needed to additionally fill a dielectric material into small spaces between the RRAM cells, which may be difficult. The semiconductor structure according to embodiments is particularly suitable for providing an embedded memory structure.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:
a substrate;
a plurality of first metal lines and a plurality of second metal lines disposed alternately in a plane that is horizontally positioned on the substrate;
an array of resistive random access memory (RRAM) elements disposed in the plane, wherein each of the RRAM elements is positioned between one of the first metal lines and one of the second metal lines that is adjacent to the one of the first metal lines, and the each of the RRAM elements comprises:
two barrier layers disposed on a sidewall of the one of the first metal lines and a sidewall of the one of the second metal lines, respectively; and
a resistance-variable layer disposed between the two barrier layers, wherein the barrier layers are more metal-rich than the resistance-variable layer;
a plurality of transistors, wherein source regions of the transistors are coupled to the first metal lines, respectively; and
a plurality of bit lines coupled to the second metal lines, respectively.

2. The semiconductor structure according to claim 1, wherein the first metal lines and the second metal lines are disposed in parallel.

3. The semiconductor structure according to claim 1, wherein the two barrier layers of the each of the RRAM elements comprise at least a material selected from the group consisting of: Al, Ti, Ta, Au, Ag, Pt, W, Ni, Ir, Cu, $NiO_x$, $Ta_yO_x$, $TiO_x$, $HfO_x$, $WO_x$, $ZrO_x$, $Al_yO_x$, $SrTiO_x$, $Nb_yO_x$ and $Y_yO_x$.

4. The semiconductor structure according to claim 1, wherein the resistance-variable layer of the each of the RRAM elements comprises at least a material selected from the group consisting of: $NiO_x$, $Ta_yO_x$, $TiO_x$, $HfO_x$, $WO_x$, $ZrO_x$, $Al_yO_x$, $SrTiO_x$, $Nb_yO_x$ and $Y_yO_x$.

5. The semiconductor structure according to claim 1, wherein the transistors are disposed on the substrate and at a level lower than the plane, and the bit lines are disposed at a level higher than the plane.

6. The semiconductor structure according to claim 1, wherein the transistors are coupled to a plurality of word lines, respectively.

7. A semiconductor structure, comprising:
a memory unit structure, comprising:
a transistor;
a first electrode and two second electrodes disposed in a horizontal plane, wherein the first electrode is disposed between the two second electrodes, and the first electrode and the two second electrodes are disposed in parallel, and wherein the first electrode is coupled to a source region of the transistor; and
two resistive random access memory (RRAM) elements, wherein one of the two RRAM elements is disposed between the first electrode and one of the two second electrodes, and the other one of the two RRAM elements is disposed between the first electrode and the other one of the two second electrodes;
wherein the one of the two RRAM elements comprises:
two barrier layers disposed on a sidewall of the first electrode and a sidewall of the one of the two second electrodes, respectively; and
a resistance-variable layer disposed between the two barrier layers of the one of the two RRAM elements, wherein the barrier layers of the one of the two RRAM elements are more metal-rich than the resistance-variable layer of the one of the two RRAM elements; and
wherein the other one of the two RRAM elements comprises:
two barrier layers disposed on the other sidewall of the first electrode and a sidewall of the other one of the two second electrodes, respectively; and
a resistance-variable layer disposed between the two barrier layers of the other one of the two RRAM elements, wherein the barrier layers of the other one of the two RRAM elements are more metal-rich than the resistance-variable layer of the other one of the two RRAM elements.

8. The semiconductor structure according to claim 7, wherein the memory unit structure comprises two RRAM cells coupled to the transistor, wherein one of the two RRAM cells comprises the first electrode, the one of the two second electrodes and the one of the two RRAM elements, and the other one of the two RRAM cells comprises the first electrode, the other one of the two second electrodes and the other one of the two RRAM elements.

9. The semiconductor structure according to claim 7, wherein the two barrier layers of the one of the two RRAM elements and the two barrier layers of the other one of the two RRAM elements comprise at least a material selected from the group consisting of: Al, Ti, Ta, Au, Ag, Pt, W, Ni, Ir, Cu, $NiO_x$, $Ta_yO_x$, $TiO_x$, $HfO_x$, $WO_x$, $ZrO_x$, $Al_yO_x$, $SrTiO_x$, $Nb_yO_x$ and $Y_yO_x$.

10. The semiconductor structure according to claim 7, wherein the resistance-variable layer of the one of the two RRAM elements and the resistance-variable layer of the other one of the two RRAM elements comprise at least a material selected from the group consisting of: $NiO_x$, $Ta_yO_x$, $TiO_x$, $HfO_x$, $WO_x$, $ZrO_x$, $Al_yO_x$, $SrTiO_x$, $Nb_yO_x$ and $Y_yO_x$.

* * * * *